United States Patent
Pierrejean

(12) 
(10) Patent No.: US 6,388,384 B1
(45) Date of Patent: May 14, 2002

(54) PULSE MODE ELECTRON GENERATOR

(75) Inventor: Didier Pierrejean, Villaz (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/543,154

(22) Filed: Apr. 4, 2000

(30) Foreign Application Priority Data

Apr. 22, 1999 (FR) ............................................ 99 05087

(51) Int. Cl.$^7$ ................................................. H01J 7/24
(52) U.S. Cl. .............................. 315/111.81; 315/169.1; 313/310; 313/336; 313/351
(58) Field of Search ..................... 315/169.1, 169.3, 315/111.81; 345/74, 75; 313/310, 351, 309, 336

(56) References Cited

U.S. PATENT DOCUMENTS

| | | | | |
|---|---|---|---|---|
| 3,668,384 A | * | 6/1972 | Moorman et al. | ..... 250/41.9 TF |
| 4,990,766 A | * | 2/1991 | Simms et al. | ......... 250/213 VT |
| 5,780,960 A | * | 7/1998 | Vickers | ....................... 313/310 |
| 5,920,296 A | * | 7/1999 | Garcia | .......................... 345/74 |
| 6,081,247 A | * | 6/2000 | Bancal | ..................... 315/169.3 |

FOREIGN PATENT DOCUMENTS

FR         2 734 076 A1    11/1996

OTHER PUBLICATIONS

C. Curtis, et al.: "Spacecraft Mass Spectrometer Ion Source Employing Field Emission Cathodes" Review Scientific Instruments, vol. 57, No. 5, May 1986, pp. 989–990, XP002123493.

E. Pollard Et al.: :Electron–Impact Ionization Time–of Flight Mass Spectrometer for Molecular Beams Review of Scientific Instruments, vol. 58, No. 1, Jan. 1987, pp. 32–37, XP002123494.

* cited by examiner

*Primary Examiner*—Don Wong
*Assistant Examiner*—Thuy Vinh Tran
(74) *Attorney, Agent, or Firm*—Sughrue Mion, PLLC

(57) ABSTRACT

The pulse mode electron generator of the invention includes a field emission cathode with electron-emitting micropoints associated with a grid biased by means for positively biasing the grid and an anode attracting electrons emitted by the cathode. The grid is biased by a permanent positive pre-bias voltage generator delivering a rest voltage which is slightly lower than the emission threshold voltage of the cathode and in series with a positive pulse voltage generator delivering a pulse component of sufficient value to exceed the emission threshold voltage of the cathode. This facilitates the pulse mode production of electrons and reduces the power consumption needed to produce the electrons.

8 Claims, 2 Drawing Sheets

PULSE MODE ELECTRON GENERATOR

The present invention relates to electron generators including a field emission cathode with electron-emitting micropoints associated with a grid biased by positive grid biasing means and an anode attracting electrons emitted by the cathode.

BACKGROUND OF THE INVENTION

Field emission cathodes with electron-emitting micropoints were developed as electron generators a few years ago. The electrically conductive micropoints are formed on an appropriate conductive substrate and in cavities of an insulative layer covering the substrate, with their ends flush with a positively biased grid incorporating openings facing each cavity. The sharp tips of the micropoints produce local amplification of the electric field which encourages emission of electrons at room temperature from a threshold voltage in the order of 50 to 100 volts, depending on the construction of the array of micropoints.

Field emission cathodes of the above kind have good energy efficiency, better than that of a conventional source of electrons in the form of a tungsten filament heated to temperature from 1000 to 2000° C. and emitting electrons by a thermoelectric effect. The power required to emit electrons is of the order of 10 W for a heated tungsten electrode. The power required to emit electrons is of the order of 0.2 W for a field emission cathode.

Another advantage of field emission cathodes is their reaction speed at the start and at the end of emission of electrons.

In prior art devices, during rest periods (periods of non-emission of electrons), the grid is biased by a null voltage, i.e. the grid is at the same potential as the cathode. During emission of electrons, the grid is biased to a positive voltage higher than the emission threshold voltage of the cathode.

These field emission cathodes with electron-emitting micropoints are satisfactory for generating electrons continuously or modulated at a low frequency.

For some applications, for example time-of-flight mass spectrometers, it is necessary to generate an intermittent flow of electrons in the form of packets of electrons with the shortest possible duration, in the order of one nanosecond, and the packets of electrons must contain the highest possible number of electrons. The intermittent flow of electrons is equivalent to a current of 1 mA to 2 mA.

In this case, field emission cathodes require generators capable of biasing the grid with electrical pulses with a duration of the order of one nanosecond and of sufficient amplitude to reach the emission threshold voltage of the cathode. It is difficult to produce electrical pulses of high amplitude and short duration and, because of the consumption of electrical energy in the capacitive component that the field emission cathode itself constitutes and whose plates are the grid and the substrate with the micropoints, the power required is not negligible. Note that the power consumed in this capacitive component increases with the square of the AC voltage applied to it and is proportional to its frequency.

OBJECTS AND SUMMARY OF THE INVENTION

The present invention addresses the problem of designing a new pulse mode electron generator with a field emission cathode that significantly reduces power consumption in pulse mode and significantly facilitates control of the cathode by an electrical pulse generator that is easier to implement.

Another object of the invention is to improve the pulse mode of the electron generator by reducing the duration of the rising and falling edges of the electron pulses.

To achieve the above and other objects, the invention provides a pulse mode electron generator including a field emission cathode with electron-emitting micropoints associated with a grid biased by means for positively biasing the grid and an anode attracting electrons emitted by the cathode, and wherein the means for positively biasing the grid generate a grid bias voltage taking:

a rest voltage value which, during non-emission of electrons, remains only slightly lower than the active bias voltage of the grid from which the anode receives a non-negligible flow of electrons from the cathode, or an emission voltage value which, during emission of electrons, is higher than said active bias voltage of the grid.

Between the step of non-emission of electrons and the step of emission of electrons, the amplitude of the bias voltage is modified by an amount equal to the difference between the emission voltage and the rest voltage. That amplitude is therefore only a fraction of the emission voltage. The power consumed in each pulse cycle is therefore greatly reduced, because only this difference between the emission voltage and the rest voltage enters into the computation of the power, in which it is squared. It is also easier to produce a pulse with steep fronts if its amplitude is equal only to the difference between the emission voltage and the rest voltage. This simplifies implementation of the bias generator and this improves the waveform of the packets of electrons emitted by the generator.

In one embodiment, the rest voltage is slightly lower than the cathode emission threshold voltage. The resulting generator is of structure that is particularly simple, including no components other than those ordinarily used in field emission cathodes with electron-emitting micropoints.

Instead of this feature, or in addition to it, a transparent repulsive grid can be disposed between the cathode grid and the anode and biased slightly below the cathode emission threshold voltage, in order to repel towards the cathode electrons having insufficient energy during non-emission of electrons and to allow through electrons having sufficient energy during emission of This prevents emission of electrons more reliably during non-emission steps and can make it possible to use a slightly higher rest voltage for permanent biasing of the grid.

In practice, the means for positively biasing the grid can generate a grid bias voltage including a permanent positive pre-bias voltage on which there is superimposed a positive bias voltage pulse component To simplify implementation of the grid bias generator, the means for positively biasing the grid can include a permanent positive pre-bias voltage generator delivering said permanent positive pre-bias voltage in series with a positive pulse voltage generator delivering said positive bias voltage pulse component.

Said positive bias voltage pulse component preferably has an amplitude of only a few volts. It is easy to generate a pulse have a duration of one nanosecond and an amplitude of approximately 10 volts.

The flow of electrons emitted by generators of the above kind takes substantially the same form as the signal consisting of said positive bias voltage impulse component.

BRIEF DESCRIPTION OF THE DRAWINGS

Other objects, features and advantages of the present invention emerge from the following description of particular embodiments, which is given with reference to the accompanying drawings, in which.

MORE DETAILED DESCRIPTION

Figure 1:
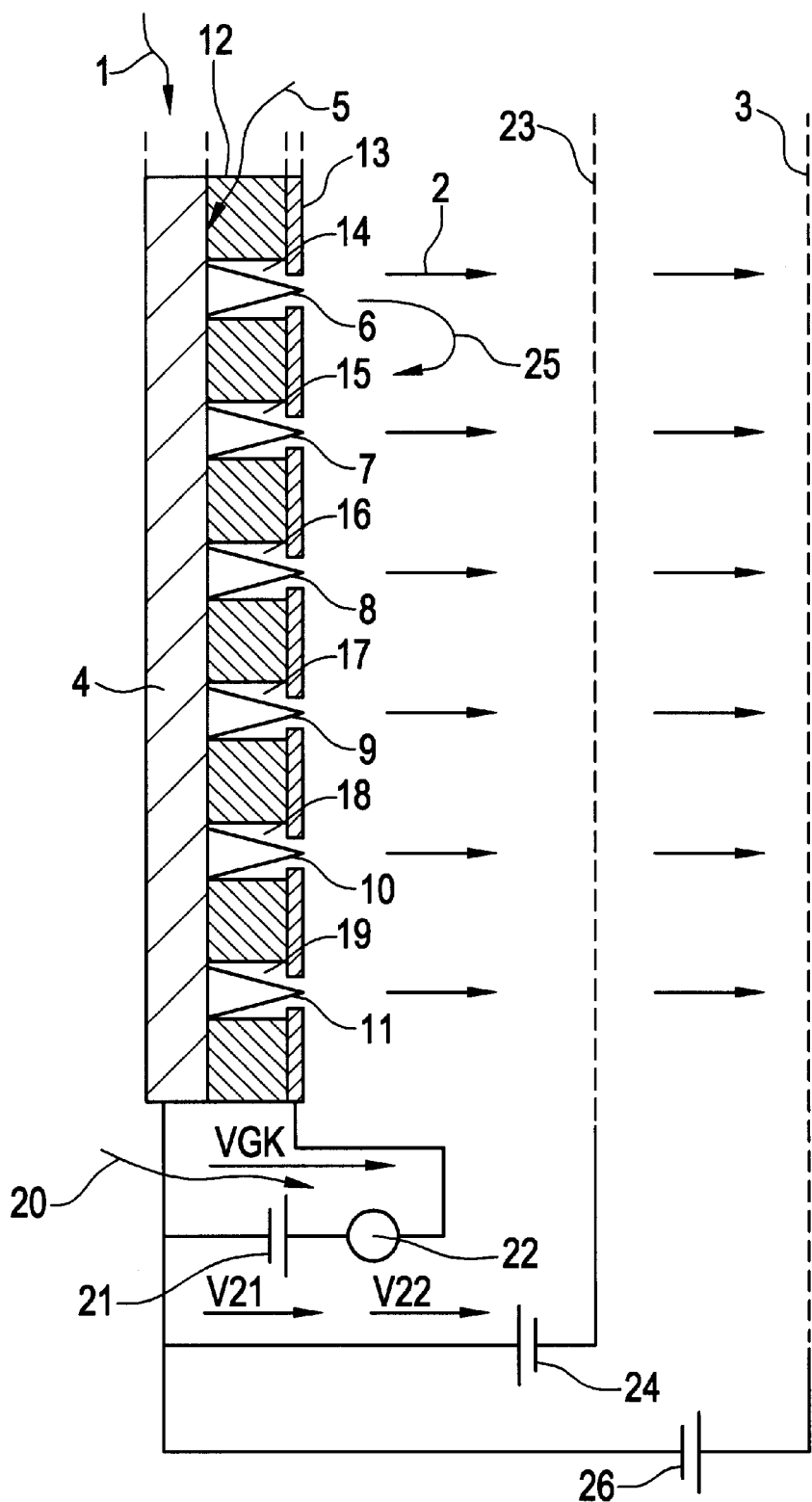
FIG. 1 is a diagrammatic view of one embodiment of a pulse mode electron generator of the present invention.

Referring to FIG. 1, a pulse mode electron generator of the present invention includes a field emission cathode 1 to generate a flow 2 of electrons biased by an anode bias generator 26.

The field emission cathode 1 conventionally includes a conductive substrate 4, for example a silicon substrate, having an active face 5 on which micropoints 6–11 are disposed. The active face 5 is covered with an insulative layer 12, for example a silicon oxide layer, separating it from a conductive grid 13. The micropoints 6–11 occupy respective cavities 14–19 in the insulative layer 12 and communicating towards the anode 3 via corresponding openings in the grid 13. The tips of the micropoints 6–11 are flush with the surface of the grid 13.

The height and width of the cavities 14–19, and therefore the height and width of the micropoints 6–11, are of the order of one micron. Arrays of micropoints are generally formed at a density in the order of 10 000 to 100 000 micropoints per mm$^2$.

Means 20 for positively biasing the grid are connected between the substrate 4 and the grid 13 to bias the grid 13 positively.

In the embodiment shown in the figure, the means 20 for positively biasing the grid include a permanent positive pre-bias voltage generator 21 delivering a permanent positive pre-bias voltage V21 and in series with a positive pulse voltage generator 22 delivering a positive bias voltage pulse component V22. For example, FIG. 3 shows the permanent positive pre-bias voltage V21 in the form of a DC voltage VR and the positive bias voltage pulse component V22 in the form of rectangular pulses of amplitude VI.

Figure 3:
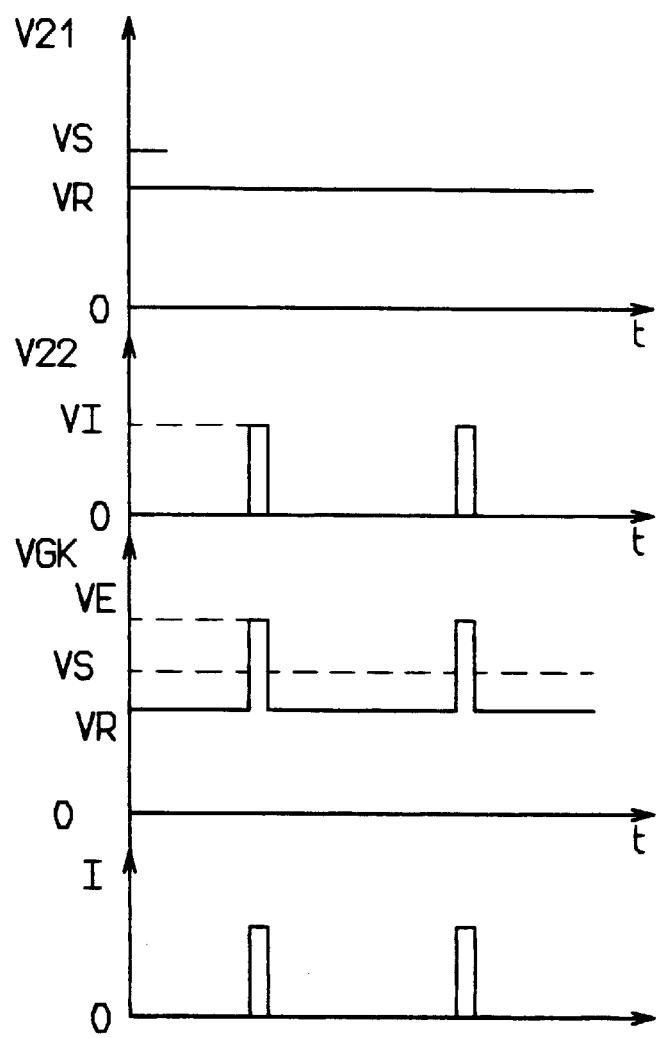
FIG. 3 shows the grid bias voltage and the electric current corresponding to the resulting flow of electrons.

The third graph in FIG. 3 shows the grid bias voltage VGK resulting from summing the voltage V21 and the voltage V22 and including a rest voltage VR and an emission voltage VE, with VE=VR+VI.

Figure 2:
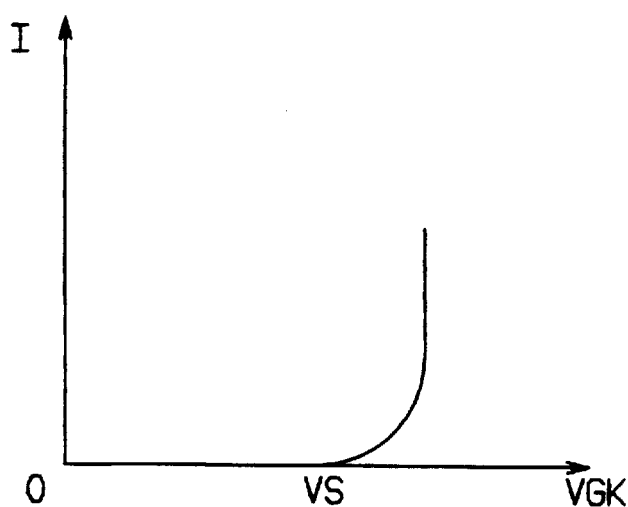
FIG. 2 shows the voltage/current characteristics of a field emission cathode.

Referring to FIG. 2, showing the current/voltage characteristic of a field emission cathode, note that there is no electric current I corresponding to the flow of electrons emitted by the cathode if the grid bias voltage VGK is lower than an emission threshold voltage VS of the cathode. Above the emission threshold VS, the bias voltage VGK of the grid relative to the cathode produces a current I of electrons which increases exponentially as a function of the voltage. The threshold voltage VS is generally of the order of 50 to 100 volts, depending on the design of the array of micropoints of the cathode.

In the present invention, a rest voltage VR is chosen which remains only slightly lower than the active bias voltage VA of the grid 13 during non-emission of electrons. The active bias voltage VA of the grid 13 is defined as the bias voltage VGK from which the anode 3 3 receives a non-negligible flow of electrons from the cathode 1. An emission voltage VE is chosen which is higher than said active bias voltage VA of the grid 13 during emission of electrons.

In a simplified embodiment, the emission threshold voltage VS of the cathode 1 is chosen as the active bias voltage VA. In practice, the rest voltage VR can then be chosen to be slightly lower than the emission threshold voltage VS of the cathode 1.

If necessary, to be certain of canceling the flow of electrons during rest periods, a transparent repulsive grid 23 can also be provided, as shown in FIG. 1. The transparent repulsive grid 23 is placed in the flow of electrons between the cathode grid 13 and the anode 3 and is biased by a generator 24 to a voltage slightly lower than the emission threshold voltage VS of the cathode 1. The transparent repulsive grid 23 therefore repels towards the cathode 1 electrons 25 having insufficient energy during non-emission of electrons but allows through electrons 2 which have had sufficient energy conferred on them by the emission bias voltage VE during emission of electrons.

In this embodiment with the transparent repulsive grid 23, an active bias voltage VA which is slightly higher than the emission threshold voltage VS of the cathode 1 can be chosen.

In all the embodiments it is advantageous to provide a positive pulse component V22 of the bias voltage whose amplitude VI is only a few volts.

A pulse mode electron generator according to the invention can advantageously be used as an electron source in a time-of-flight mass spectrometer.

The present invention is not limited to the embodiments explicitly described but includes variants and generalizations therefore that will be evident to the skilled person.

What is claimed is:

1. A pulse mode electron generator including a field emission cathode with electron emitting micropoints associated with a grid biased by means for positively biasing the grid and an anode attracting electrons emitted by the cathode, wherein the means for positively biasing the grid generate a grid bias voltage taking:

a rest voltage value which, during non-emission of electrons, remains between zero and the active bias voltage of the grid from which the anode receives a non-negligible flow of electrons from the cathode, or an emission voltage value which, during emission of electrons, is higher than an active bias voltage of the grid.

2. The generator according to claim 1, wherein said rest voltage is between zero and lower than the emission threshold voltage of the cathode.

3. The generator according to claim 1, wherein a transparent repulsive grid is placed between the cathode grid and the anode and is biased to a voltage between zero and lower that the emission threshold voltage of the cathode in order to repel towards the cathode electrons having insufficient energy during non-emission of electrons and to allow through electrons having sufficient energy during emission of electrons.

4. The generator according to claim 1, wherein the means for positively biasing the grid generate a grid bias voltage comprising a permanent positive pre-bias voltage on which is superimposed a positive bias voltage pulse component.

5. The generator according to claim 4, wherein the means for positively biasing the grid include a permanent positive pre-bias voltage generator delivering said permanent positive pre-bias voltage and in series with a positive pulse voltage generator delivering said positive bias voltage pulse component.

6. A time-of-flight mass spectrometer, including a pulse mode electron generator having a field emission cathode with electron-emitting micropoints associated with a grid biased by means for positively biasing the grip and an anode attracting electrons emitted by the cathode, wherein the means for positively biasing the grid generate a grid bias voltage taking:
- a rest voltage value which, during emission of electrons, remains between zero and the active bias voltage of the grid from which the anode receives a non-negligible flow of electrons from the cathode, or
- an emission voltage value which, during emission of electrons, is higher than said active bias voltage of the grid.

7. A pulse mode electron generator including a field emission cathode with electron emitting micropoints associated with a grid biased by means for positively biasing the grid and an anode attracting electrons emitted by the cathode, wherein the means for positively v biasing the grid generate a grid bias voltage taking:
- an emission voltage value which, during emission of electrons is higher than an active bias voltage of the grid, or
- a rest voltage value which, during non emission of electrons, remains between 0 volt and the said active bias voltage of the grid.

8. A pulse mode electron generator including a field emission cathode with electron emitting micropoints associated with a grid biased by means for positively biasing the grid and an anode attracting electrons emitted by the cathode, wherein the means for positively biasing the grid generate a grid bias voltage comprising a permanent positive pre-bias voltage on which is superimposed a positive bias voltage pulse component.

* * * * *